(12) United States Patent
Gohara et al.

(10) Patent No.: US 6,414,474 B1
(45) Date of Patent: Jul. 2, 2002

(54) FIXED TYPE CURRENT DETECTOR

(75) Inventors: Takashi Gohara; Yasuhiro Tamai; Mitsuaki Morimoto, all of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/547,667

(22) Filed: Apr. 12, 2000

(30) Foreign Application Priority Data

May 11, 1999 (JP) .......................................... 11-130535

(51) Int. Cl.[7] ............................ G01R 1/22; G01R 15/18
(52) U.S. Cl. ................... 324/117 H; 324/127; 324/251
(58) Field of Search ............................ 324/127, 117 H, 324/117 R, 207.2, 251

(56) References Cited

U.S. PATENT DOCUMENTS

| | | | | |
|---|---|---|---|---|
| 4,266,189 A | * | 5/1981 | Karlin et al. | 324/117 H |
| 5,088,159 A | * | 2/1992 | Lafleur | 24/16 PB |
| 5,495,169 A | * | 2/1996 | Smith | 324/127 |
| 5,583,429 A | * | 12/1996 | Otaka | 324/127 |

FOREIGN PATENT DOCUMENTS

| | | | |
|---|---|---|---|
| JP | 4-364472 | 12/1992 | G01R/15/02 |
| JP | 06-174753 | 6/1994 | G01R/15/02 |

\* cited by examiner

*Primary Examiner*—N. Le
*Assistant Examiner*—Vincent Q. Nguyen
(74) *Attorney, Agent, or Firm*—Sughrue Mion, PLLC (57) ABSTRACT

A fixed type current detector 20 of the present invention includes: a magnetic flux conversing fixed member 22, which is fixed along the periphery of a long conductor 21, and which converges the magnetic flux generated around the conductor 21 at the time of current sending to the conductor 21; and a magneto-electric conversion element 23, which is integrally provided to the magnetic flux conversing fixed member 22, and which detects the magnetic flux of the magnetic flux conversing fixed member 22, and in the magnetic flux conversing fixed member 22, a high permeability member 26 to converge the magnetic flux generated around the conductor 21, is laid.

9 Claims, 8 Drawing Sheets

FIXED TYPE CURRENT DETECTOR

BACKGROUND OF THE INVENTION

The present invention relates to a fixed type current detector which is wound around and fixed to the outer periphery of a conductor such as an electric cable or bus bar, and which detects the current flowing through the conductor.

Figure 14:
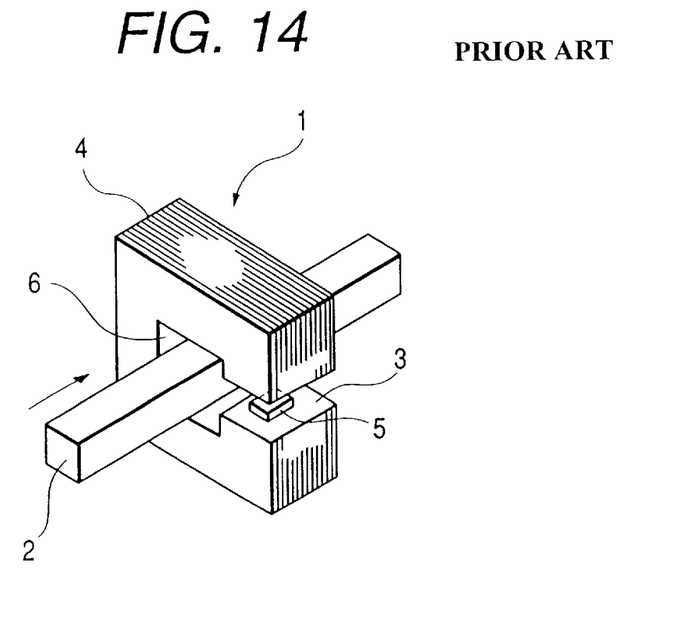
FIG. 14 is a perspective view showing the general fixed type current detector.

FIG. 14 is a perspective view showing the general current detector 1. The current detector 1 has a core 4 with a gap 3, provided around a bus bar 2 as a measured body, and a magneto-electric conversion element 5 provided in the gap 3. The core 4 and the magneto-electric conversion element 5 are integrally molded by resins, except a portion of a window 6 of the core 4.

In the current detector 1, the core 4 is arranged such that the bus bar 2 is positioned in the window 6 of the core 4. The magnetic flux generated around the bus bar 2 by the current flowing through the bus bar 2, is converged by the core 4. The converged magnetic flux is detected by the magneto-electric conversion element 5 provided in the gap 3, and converted into an electric output. According to the converted electric output, the current flowing through the bus bar 2 is measured.

Figure 15:
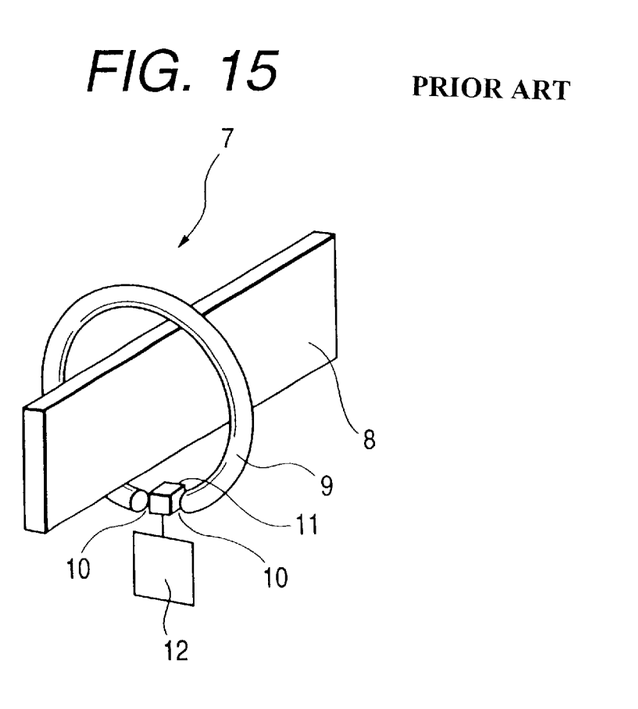
FIG. 15 is a perspective view showing another general fixed type current detector.

FIG. 15 is a perspective view showing a current detector 7 of the another general example, disclosed in JP-A-6-174753. The current detector 7 is provided with: a magnetic flux detector 9 wound around the bus bar 8 as a measured body; a gap 10 formed between both ends of the magnetic flux detector 9; and a magneto-electric conversion element 11 arranged in the gap 10. A display means 12 for displaying the current flowing through the measured bus bar 8, is provided. The magnetic flux detector 9 is formed by filling the conductive powder in a flexible bag body.

In the current detector 7, the magnetic flux detector 9 is wound around the bus bar 8, and the magnetic flux generated around the bus bar 8 by the current flowing through the bus bar 8, is converged by the magnetic flux detector 9. The converged magnetic flux is detected by the magneto-electric conversion element 11 provided in the gap 10, and converted into an electric output. According to the converted electric output, the display means 12 displays the current flowing through the bus bar 8.

The current detector 7 can cope with the shape of the bus bar 8, because the shape of the magnetic flux detector 9 can be freely changed.

However, in the current detector 1 shown in FIG. 14, when a current value for measurement is changed, it is necessary that the shape and dimensions of the core 4 are changed corresponding to the changed current, and it is necessary to change also the magneto-electric conversion element 5 corresponding to the change of the core 4.

Further, because the core 4 and the magneto-electric conversion element 5 are separately structured, there is a problem that the detection precision is greatly affected due to the positioning of the core 4 and the magneto-electric conversion element 5, or dimensions of the gap 3.

Further, for example, assuming that the bus bar 2 is the existing measured body and the current flowing through the bus bar 2, it is necessary that the existing bus bar 2 is disassembled, and the bus bar 2 is made to pass through the widow 6 of the core 4, and the bus bar is assembled again, therefore, the assembling operation is troublesome.

Further, in this current detector 1, in circumstances where there is a lot of vibration, such as a car, because the core 4 and the magneto-electric conversion element 5 are not fixed to the measured body 2, the magneto-electric conversion element 5 is caused to become displaced by the contact stress due to the vibration, or the impact stress due to the car accident. As a result, there is a problem that the detection accuracy is deteriorated.

Further, in the current detector 7 shown in FIG. 15, even when dimensions of the measured body 8 is any dimensions, the magnetic flux detector 9 can cope with the dimensions, because the magnetic flux detector 9 has the flexibility, as described above. However, because the magnetic flux detector 9 and the magneto-electric conversion element 11 are separately structured, there is a problem that, the detection accuracy is greatly affected due to dimensions of the gap 10 formed between both ends of the magnet flux detector 9, or positioning of the magneto-electric conversion element 11.

Further, in the current detector 7, in the same manner as the current detector 1, in the circumference having a lot of vibration such as a car, because the magnet flux detector 9 and the magneto-electric conversion element 11 are not fixed to the measured body 8, the magneto-electric conversion element 11 is caused to displacement by the contact stress due to the vibration, or the impact stress due to the car accident, thereby, there is a problem that the detection accuracy is deteriorated.

SUMMARY OF THE INVENTION

Accordingly, the object of the present invention is to provide a fixed type current detector which can cope with any type of the conductor without depending on the type of the conductor, and by which the slippage of position of the magneto-electric conversion element can be prevented.

In order to attain the above object, a fixed type current detector detecting a magnetic flux generated around a long conductor including:
   a magnetic flux converging fixed member fixed around the periphery of said long conductor, said magnetic flux converging fixed member converging magnetic flux; and
   a magneto-electric conversion element integrally provided with said magnetic flux converging fixed member, said magneto-electric conversion element detecting converged magnetic flux.

In the fixed type current detector, when the current flowing through the conductor is detected, the magnetic flux conversing fixed member is wound along the outer periphery of the conductor and fixed. In this state, when the current flows through the conductor, the magnetic flux generated around the conductor by the current flowing through the conductor is converged by the magnetic flux converging fixed member. The converged magnetic flux is detected by the magneto-electric conversion element integrally provided to the magnetic flux converging fixed member, and converted into the electrical output.

Because this fixed type current detector is assembled onto the conductor and fixed by winding the magnetic flux converging member along the outer periphery of the conductor and fixing it, and the magneto-electric conversion element is integrally provided onto the magnetic flux converging fixed member, thereby, an assembling and fixing operation onto the conductor becomes easy, and at the time of the assembling and fixing operation, the positional slippage of the magneto-electric conversion element does not occur. Further, the positional slippage of the magneto-electric conversion element due to the vibration stress can be prevented. As the result, the detection accuracy is increased and stabilized.

A fixed type current detector according to above structure, said magnetic flux converging fixed member includes:

a band portion wound around said periphery;

a lock portion provided on one side of said band portion, said lock portion engaging and fixing the other side of band portion;

a high permeability member integrally formed along a longitudinal direction of said band portion, said high permeability member being able to converge said magnetic flux; and said magneto-electric conversion element integrally provided with one of said band portion and said lock portion.

This fixed type current detector fixes the band portion onto the conductor by winding the band portion around the outer periphery of the conductor, and by engaging and fixing the other end of the band portion with and to the lock portion provided on one side of the band portion. In this state, when the current flows through the conductor, the magnetic flux generated around the conductor by the current flowing through the conductor, is converged by the high permeability member which is integrally formed onto the band portion. The converged magnetic flux is detected by the magneto-electric conversion element provided on either one of the lock portion or band portion, and converted into the electric output.

In this fixed type current detector, because the band portion with which the high permeability member is integrally formed, and the lock portion which is provided on one side of the band portion and which engages with and fixes the other side of the band portion wound around the outer periphery of the conductor, are integrally formed, thereby, this fixed type current detector can cope with any type of the conductor without depending on the type of the conductor, and can be easily assembled and fixed.

Further, because the magneto-electric conversion element is integrally provided to the lock portion, and assembled and fixed onto the conductor integrally with the band portion, the magneto-electric conversion element is arranged in the closest distance to the conductor, and the positional slippage of the magneto-electric conversion element does not occur. Further, the positional slippage of the magneto-electric conversion element due to the vibration stress can be prevented. As the result, the detection accuracy is increased and stabilized.

A fixed type current detector according to above structure, said magnetic flux converging fixed member includes:

a base portion;

a surrounding portion integrally provided with said base portion, said surrounding portion fixed around said periphery;

a high permeability member integrally provided with surrounding portion, said high permeability member being able to converge said magnetic flux; and said magneto-electric conversion element integrally provided with one of said base portion and said surrounding portion.

In this fixed type current detector, the surrounding portion is fixed onto the conductor by winding the surrounding portion around the outer periphery of the long conductor. In this state, when the current flows though the conductor, the magnetic flux generated around the conductor by the current flowing through conductor is converged by the high permeability member which is integrally formed in the surrounding portion. The converged magnetic flux is detected by the magneto-electric conversion element integrally provided on the base portion, and converted into the electrical output.

In this fixed type current detector, because the surrounding portion with which the high permeability member is integrally formed, is integrally formed with the base portion, assembling onto the conductor can be easily conducted.

Further, because the magneto-electric conversion element is integrally provided on the base portion, and is assembled and fixed onto the conductor integrally with the surrounding portion, the magneto-electric conversion element is arranged in the closest distance to the conductor, and the positional slippage of the magneto-electric conversion element does not occur. Further, the positional slippage of the magneto-electric conversion element due to the vibration stress can be prevented. As the result, the detection accuracy is increased and stabilized.

A fixed type current detector according to above structure, said high permeability member is formed by a plurality of layers.

In this fixed type current detector, because the high permeability member is formed into multi-layers, the first layer of the high permeability member arranged on the conductor side converges the magnetic flux generated around the conductor, and the second layer and subsequent layers of the high permeability member converge the magnetic flux due to the disturbance. As the result, because the influence due to the disturbance is reduced, thereby, the high accurate detection can be carried out.

A fixed type current detector according to above structure, wherein said long conductor is wound and fixed in a plurality of said fixed type current detectors, and said long conductor is formed by a plurality of electric wires.

By arranging the fixed type current detectors around a plurality of electric cables, the current flowing through the plurality of electric cables can be accurately detected.

DETAIL DESCRIPTION OF PREFERRED EMBODIMENTS

The fixed type current detector according to the present invention will be described below.

The First Embodiment

Figure 1A:
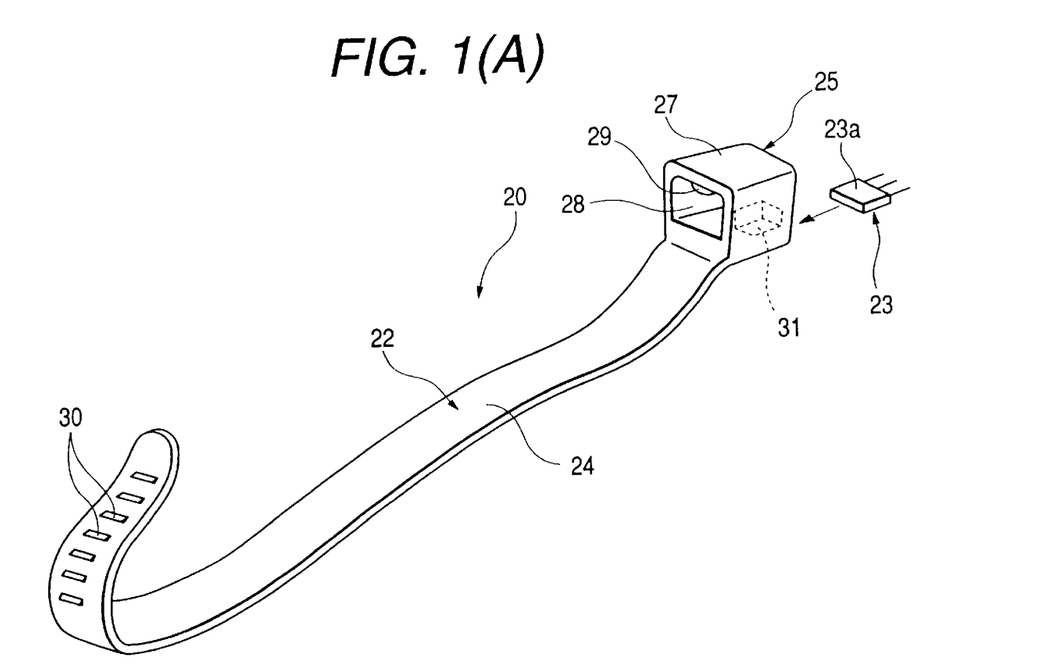
FIG. 1A is a perspective view of a fixed type current detector of the first embodiment.
Figure 1B:
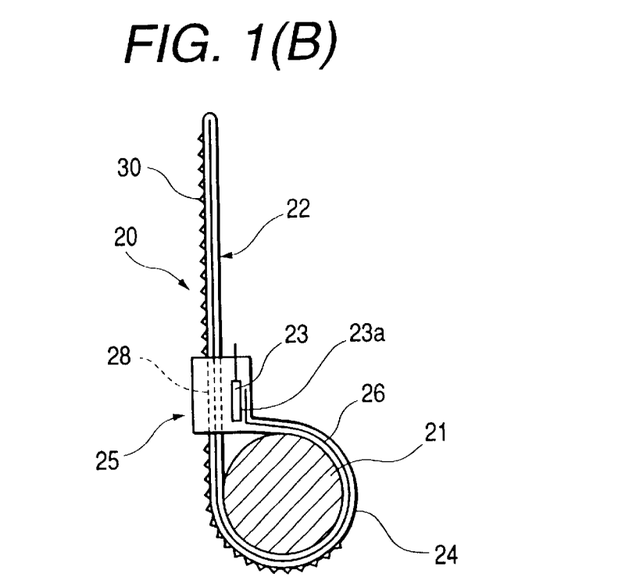
FIG. 1B is a sectional view showing the state of its attachment around a conductor of a fixed type current detector of the first embodiment.

By using FIG. 1A, 1B to FIG. 9, the first embodiment will be described. FIG. 1A is a perspective view showing the fixed type current detector of the first embodiment. FIG. 1B is a sectional view showing a state that the fixed type current detector is fixed along the peripheral direction of the conductor 21.

As shown in FIGS. 1A and 1B, a fixed type current detector 20 of the present embodiment is fixed along the peripheral direction of a conductor 21, such as an electrical cable, and has a magnetic flux converging fixed member 22 to converge the magnetic flux generated around the conductor 21 at the time of current sending to the conductor 21, and a magneto-electric conversion element 23 which is integrally provided onto the magnetic flux converging fixed member 22 and detects the magnetic flux of the magnetic flux converging fixed member 22.

The magnetic flux conversing fixed member 22 is formed of a band portion 24 formed of resins and having the flexibility; a lock portion 25 provided on one side of the band portion 24; and a high permeability member 26 integrally formed along the longitudinal direction of the band 24. Because the band portion 24 has the flexibility, it can be wound around the outer periphery of the conductor 21 with the arbitrary shape, without depending on the shape of the conductor 21.

Figure 2:
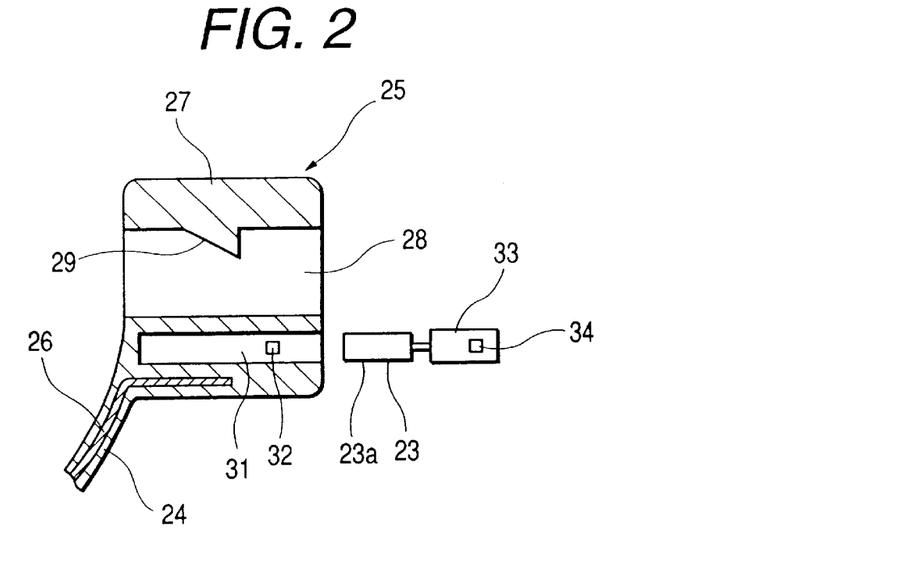
FIG. 2 is an enlarged sectional view of the lock portion of the fixed type current detector shown in FIG. 1.

As shown in FIG. 1B and FIG. 2, the lock portion 25 is formed of a lock portion main body 27 integrally formed on one side of the band portion 24; a band portion insertion hole 28 which is formed on the lock portion main body 27 and into which the other end of the band portion 24 is inserted; and an engaging claw 29 which is provided on the inner wall of the band portion insertion hole 28 and with which the other side of the inserted band portion 24 is engaged and fixed. On the one hand, as shown in FIGS. 1A and 1B, a plurality of engagement projection 30 formed in the crossing direction to the longitudinal direction of the band portion 24 are provided on the other side of the band portion 24 with a predetermined interval.

Figure 3:
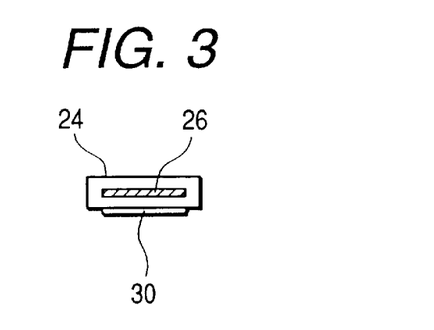
FIG. 3 is a sectional view showing a band portion of the fixed type current detector shown in FIG. 1.

Further, as shown in FIG. 1B and FIG. 3, in the band portion 24, the high permeability member 26 is integrally laid along the longitudinal direction of the band portion 24. When this band portion 24 is wound around the outer periphery of the conductor 21 such as a electric cable, and the other side is inserted into the band portion insertion hole 28, and the engagement projection 30 is engaged with the engaging claw 29 provided on the lock portion 25, the band portion 24 is fixed on the conductor 21.

The band portion 24, which is wound around and fixed to the outer periphery of the conductor 21, converges the magnet flux generated around the conductor 21 by the current flowing through the conductor 21 at the time of current sending to the conductor 21 by the high permeability member 26 integrally laid along the longitudinal direction of the band portion 24.

As shown in FIG. 2, a magneto-electric conversion element engagement portion 31, in which the magneto-electric conversion element engagement 23 is engaged, is substantially formed in parallel with the band portion insertion hole 28 on the lock portion main body 27. An engagement portion 32 to fix the engaged magneto-electric conversion element 23 is provided in this magneto-electric conversion element engagement portion 31.

The magneto-electrical conversion element 23 is formed of, for example, the Hall element. A magneto-electrical conversion element fixed portion 33 is provided on the magneto-electrical conversion element 23. An engagement portion 34 to be engaged with the engagement portion 32 provided on the magneto-electric conversion element engagement portion 31 is provided on the magneto-electrical conversion element fixed portion 33. When the magneto-electrical conversion element 23 is engaged in the lock portion 25, when the engagement portion 34 of the magneto-electrical conversion element fixed portion 33 is engaged with the engagement portion 32 provided on the magneto-electric conversion element engagement portion 31, and the magneto-electric conversion element 23 is integrally fixed with the lock portion 25.

In the magneto-electric conversion element 23, a magnetic flux detection surface 23a of the magneto-electric conversion element 23 is arranged in the direction perpendicular to the direction of the magnetic flux converged by the high permeability member 26 of the band portion 24. Incidentally, the magneto-electric conversion element 23 is connected to an over current protection apparatus (not shown) through the magneto-electric conversion element connecting portion and magneto-electric conversion element fixed member 33.

The fixed type current detector 20 described above is fixed on the outer periphery of the conductor 21 by the band portion 24 wound around the outer periphery of the long conductor 21 the other side inserted into the band portion insertion hole 28 of the lock portion 25, and the engagement protrusion 30 is engaged with the engaging claw 29 provided on the lock portion 25.

In this state, when the current flows through the conductor 21, the magnetic flux generated around the conductor 21 by the current flowing through the conductor 21 is converged by the high permeability member 26 integrally formed with the band portion 24. The converged magnetic flux is detected by the magneto-electric conversion element 23 engaged in the lock portion 25, and converted into an electrical output. Then, the converted electrical output is supplied to the over current protection apparatus (not shown).

Figure 5:
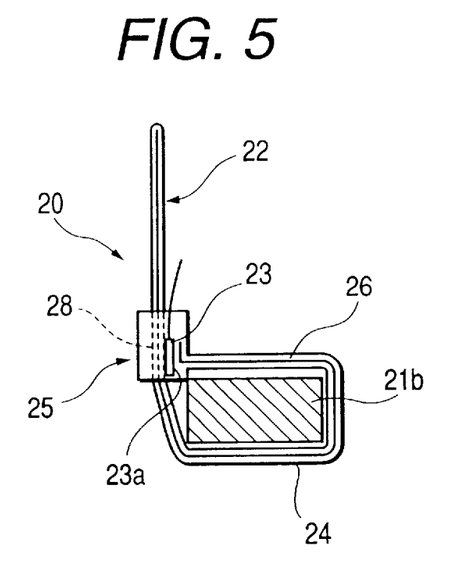
FIG. 5 is sectional view showing a state that the fixed type current detector shown in FIG. 1 is attached onto a conductor having the different sectional shape.

In the present embodiment, because the band portion 24 having the flexibility with which the high permeability member 26 is integrally formed in the longitudinal direction, and the lock portion 25 which is provided on one side of the band portion 24, and engages with and fixes the other side of the band portion 24 wound around the outer periphery of the conductor, are integrally formed, the fixed type current detector 20 can cope with any type of the conductor 21 without depending on the type (shape, dimensions) of the conductor 21, and can be easily assembled and fixed. That is, as shown in FIG. 5, even when the conductor 21b has a rectangular cross section, by winding the band portion 24 around the conductor 21b, the fixed type current detector 20 can be fixed.

Further, because the magneto-electric conversion element 23 is engaged in the lock portion 25 and is assembled and fixed onto the conductor 21 integrally with the band portion 24, the magneto-electric conversion element 23 is arranged in the closest distance to the conductor 21. As the result, the magneto-electric conversion sensitively of the magneto-electric conversion element 23 is increased, and the detection accuracy is increased.

Further, because the magneto-electric conversion element 23 is fixed onto the conductor 21 integrally with the band portion 24, when the magneto-electric conversion element 23 is assembled onto the conductor 21, the positional relationship of the magneto-electric conversion element 23 to the conductor 21 is not slipped.

Further, because the positional slippage of the magneto-electric conversion element 23 due to the vibration stress or impact stress is prevented, the detection accuracy is stabled.

Figure 4:
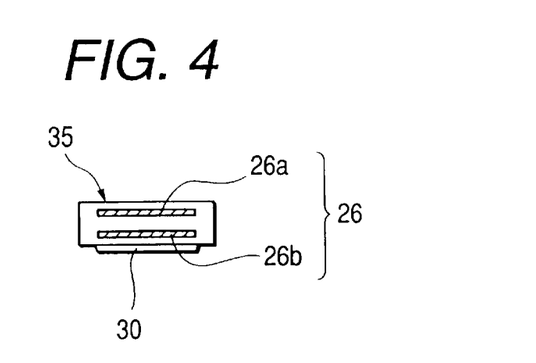
FIG. 4 is a sectional view showing an example of the modification of the band portion of the fixed type current detector shown in FIG. 1.

FIG. 4 shows a modification of the arrangement of the high permeability member 26 of another band portion 35.

This band portion 35 is formed such that 2 high permeability members 26a and 26b are arranged in 2 layers along the longitudinal direction of the band portion 35 and integrally laid with the band portion 35.

In this band portion 35, the band portion 35 is wound around the outer periphery of the conductor 21, and when the current flows through the conductor 21, the magnetic flux generated around the conductor 21 by the current flowing through the conductor 21 is converged by the high permeability member 26a of the first layer (conductor 21 side), and the magnetic flux due to the disturbance is converged by the high permeability member 26b of the second layer (outside). As the result, the influence due to the disturbance can be reduced, and the detection accuracy can be increased. Incidentally, in this example, an example of 2 layers is shown, however, more than 3 layers of the high permeability members may be provided. In this case, the influence due to the disturbance can be further reduced, and the detection accuracy can be further increased.

Figure 6A:
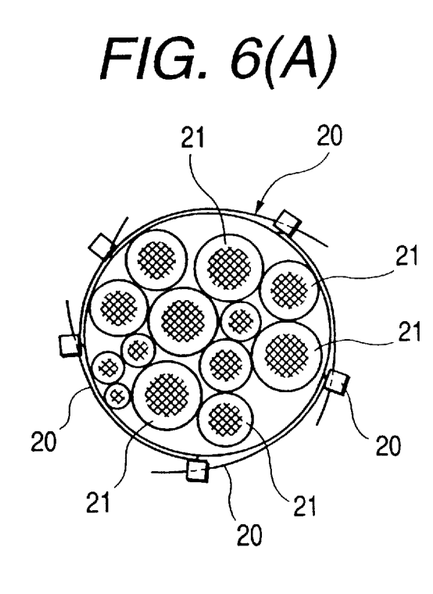
FIG. 6A is a sectional view showing an example of the modification of the first embodiment in which a plurality of fixed type current detectors are arranged around a plurality of electric cables.

An example of a modification shown in FIG. 6A is an example in which a plurality of fixed type current detectors 20, 20, . . . are assembled and fixed around a plurality of conductors 21. In this case, the results detected by respective current detectors 20, 20, . . . are, electrically processed, for example averaging the results, thereby, the current values flowing through the plurality of conductors 21, 21, . . . can be accurately detected.

Figure 6B:
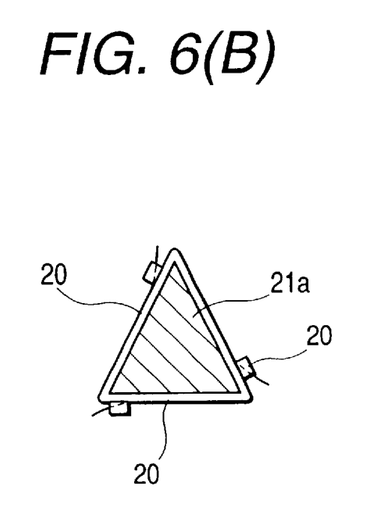
FIG. 6B is a sectional view showing an example of the modification of the first embodiment in which a plurality of fixed type current detectors are arranged around the conductor having the different sectional shape.

Further, as shown in FIG. 6B, when a plurality of fixed type current detectors 20, 20, . . . are assembled and fixed around the conductor 21a having the triangular cross section, the current value flowing through the conductor 21a can be accurately detected in the same manner as described above.

Figure 7A:
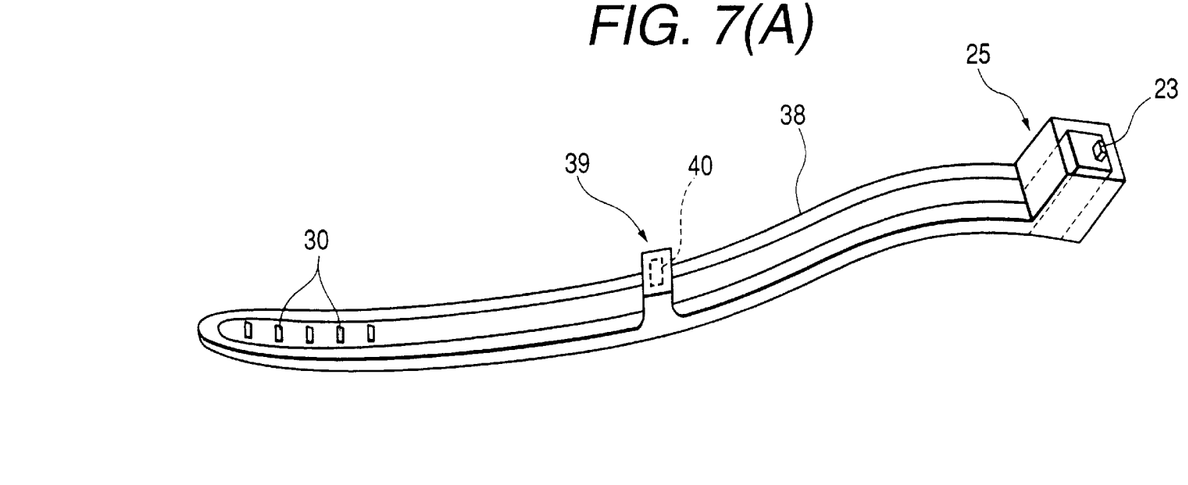
FIG. 7A is perspective view of the fixed type current detector in which a magneto-electric conversion element attaching portion is provided on the band portion.
Figure 7B:
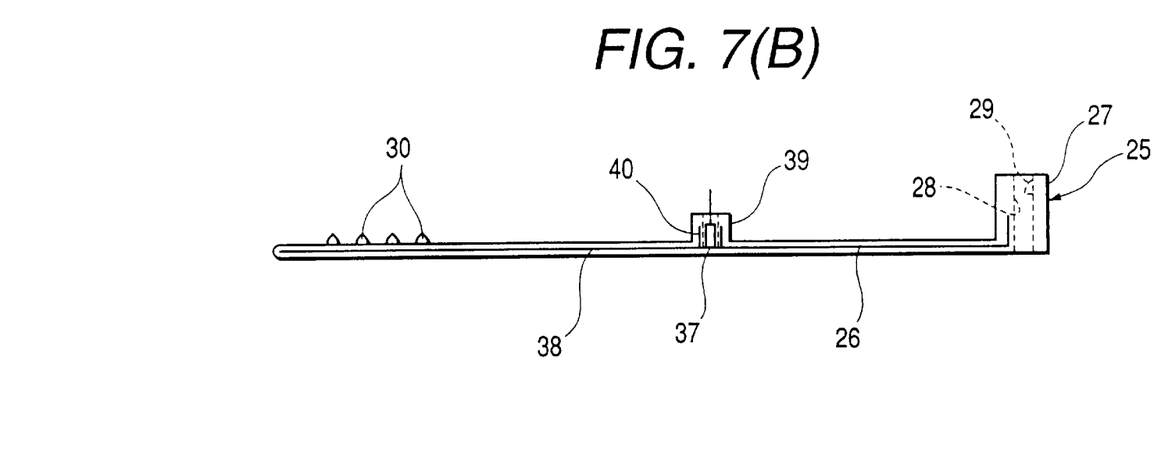
FIG. 7B is a side view of the fixed type current detector in which a magneto-electric conversion element attaching portion is provided on the band portion.

Examples of modifications shown in FIGS. 7A and 7B are examples in which the magneto-electric conversion element 37 is provided in the middle of the band portion 38, except the lock portion 25.

Figure 8:
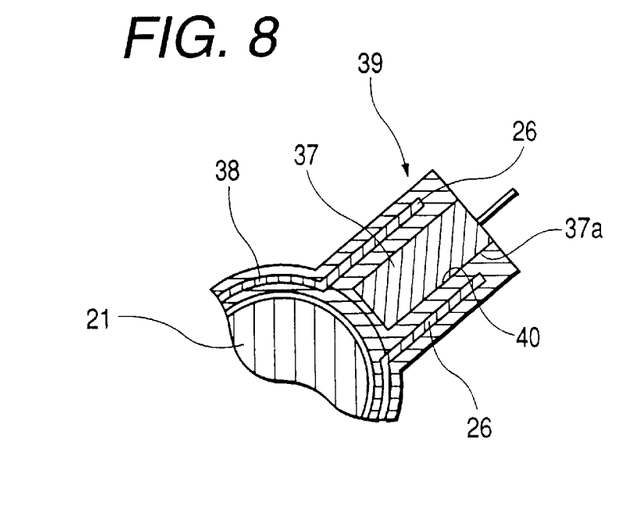
FIG. 8 is a sectional view showing the magneto-electric conversion element attaching portion, in the fixed type current detector shown FIG. 7.

As shown in FIGS. 7A and 7B, a magneto-electric conversion element attachment portion 39 is integrally protruded in the middle portion in the longitudinal direction of the band portion 38. A magneto-electric conversion element engagement portion 40 is provided at the magneto-electric conversion element attachment portion 39 along the perpendicular direction to the band portion 38. As shown in FIG. 8, the magneto-electric conversion element 37 is engaged and fixed in this magneto-electric conversion element engagement portion 40. End portions of the high permeability members 26 are respectively arranged in opposite inner walls of the magneto-electric conversion element engagement portion 40,. Thereby, the magneto-electric conversion element 37 is arranged such that the magneto-electric conversion element 37 is sandwiched between both end portions of the high permeability members 26, and the magnetic flux is incident substantially perpendicularly to the magnetic flux detection surface 37a of the magneto-electric conversion element 37.

In this example, because the magneto-electric conversion element 37 is engaged in the magneto-electric conversion element attachment portion 39 provided on the band portion 38, and is assembled and fixes integrally with the band portion 38 on the conductor 21 and fixed, the magneto-electric conversion element 37 is arranged in the closest distance to the conductor 21. As the result, the detection accuracy is increased.

Figure 9:
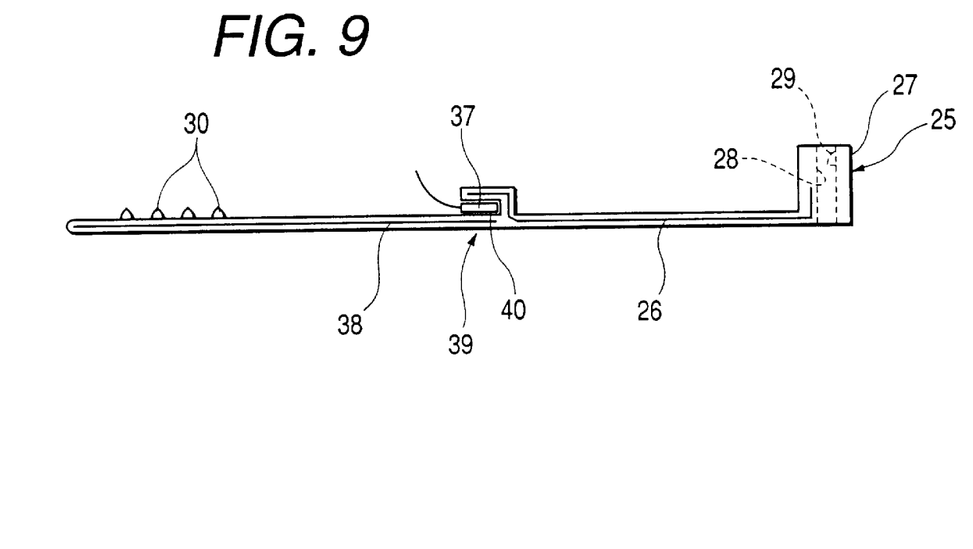
FIG. 9 shows an example of the modification of the fixed type current detector shown in FIG. 7, and a side view in which the magneto-electric conversion element engagement portion is provided along the band portion.

In FIG. 9, the shape of the magneto-electric conversion element attachment portion 39 is different to the example shown in FIGS. 7A and 7B. As shown in FIG. 9, in the magneto-electric conversion element attachment portion 39 in this example, the magneto-electric conversion element engagement portion 40 is also provided along the longitudinal direction of the band portion 38, and the magneto-electric conversion element 37 is arranged almost in parallel to the band portion 38.

The Second Embodiment

Figure 10:
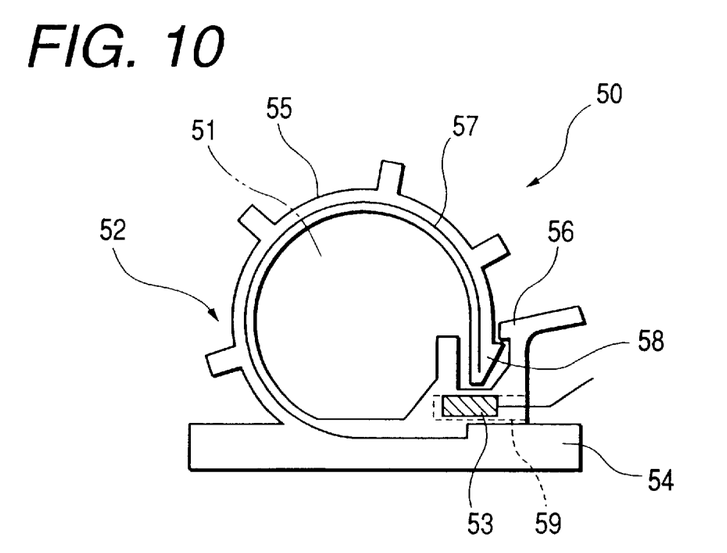
FIG. 10 is a side view showing the fixed type current detector of the second embodiment.
Figure 11:
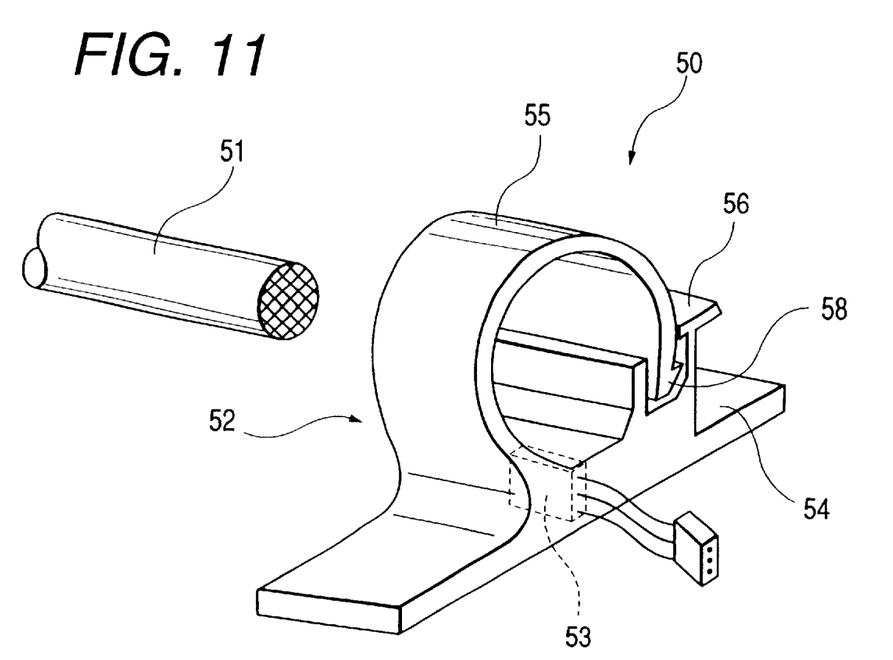
FIG. 11 shows an example of the modification of the fixed type current detector of FIG. 10, and is a perspective view showing the state that the magneto-electric conversion element is provided on the surrounding portion.

The second embodiment will be described by using FIG. 10 and FIG. 11. FIG. 10 is a sectional view showing a fixed type current detector 50 of the second embodiment, and FIG. 11 is an example of a modification of the fixed type current detector 50 shown in FIG. 10.

The second embodiment is used for a conductor 51 such as a electric wire formed substantially circle in cross section, or a wire harness having a plurality of electric wire.

As shown in FIG. 10, the fixed current detector 50 is fixed along the periphery of the conductor 51 such as an electric wire, and the fixed current detector 50 includes, a magnetic flux converging fixed member 52 which converges the magnetic flux generated around the conductor 51 when the current flows through the conductor 51, and a magneto-electric conversion element 53 which is integrally provided with the magnetic flux converging fixed member 52 and detects the magnetic flux of the magnetic flux converging member 52.

The magnetic flux converging fixed member 52 is formed of: a base portion 54 formed of resins; a surrounding portion 55 which is integrally provided with the base portion 54 and wound around the outer periphery of the conductor 51; an engagement portion 56 to fix a free end side of the surrounding portion 55; and a high permeability member 57 which is provided on the surrounding portion 55 and can converge the magnetic flux generated around the conductor 51.

The surrounding portion 55 has the flexibility, and an engagement projection 58 is formed on its free end side. The high permeability member 57 is integrally laid along the surrounding direction n the surrounding portion 55. The engagement portion 56 is integrally formed on one side of the base portion 54.

Then, the surrounding portion 55 is wound around the outer periphery of the conductor 51 such as an electric cable when the engagement projection 58 formed on the free end side is engaged with the engagement portion 56 provided on the base portion 54, the surrounding portion 55 is fixed on the conductor 51.

In this manner, the surrounding portion 55 wound around the outer periphery of the conductor 51 converges the magnetic flux generated around the conductor 51 by the current flowing through the conductor 51 at the time of current sending to the conductor 51, by the high permeability member 57 which is integrally laid along its surrounding direction.

Further, a magneto-electric conversion element engagement portion 59 to engage the magneto-electric conversion element 53 is formed on the base portion 54. The magneto-electric conversion element 53 engaged with the magneto-electric conversion element engagement portion 59, is arranged in the direction in which the magnetic flux detection surface of the magneto-electric conversion element 53 is perpendicular to the magnet flux converged by the high permeability member 57 of the surrounding portion 55. The magneto-electric conversion element 53 is connected to an over current protection apparatus (not shown).

This fixed type current detector 50 is fixed on the outer periphery of the conductor 51 by that the surrounding portion 55 is wound around the outer periphery of the conductor 51, the engaging projection 58 formed on the free end side is engaged with engaging portion 56 provided on the base portion 54.

In this state, when the current flows through the conductor 51, the magnetic flux generated around the conductor 51 by the current flowing through the conductor 51, is converged by the high permeability member 57 integrally formed with the surrounding portion 55. The converged magnetic flux is detected by the magneto-electric conversion element 53 engaged in the base portion 54, and is converted into an electrical output. Then, the converted electrical output is supplied to the over current protection apparatus (not shown).

In the present embodiment, because the base portion 54 and the surrounding portion 55 are integrally formed, and the magneto-electric conversion element 53 is engaged in the base portion 54, and is assembled and fixed onto the conductor 51 integrally with the surrounding portion 55, thereby, at the time of assembling onto the conductor 51, the positional relationship of the magneto-electric conversion element 53 to the conductor 51 is not slipped, and the fixed type current detector 50 can be easily assembled and fixed.

Further, because the magneto-electric conversion element 53 is arranged in the closest distance to the conductor 51, the magneto-electric conversion detection sensitivity of the magneto-electric conversion element 53 is increased, and the detection accuracy is increased.

The positional slippage of the magneto-electric conversion element 53 due to the vibration stress or impact stress is prevented, and the detection accuracy is stabilized.

In an example of the modification shown in FIG. 11, the arrangement of the magneto-electric conversion element 53 is different from that in the example shown in FIG. 10. That is, in the example shown in FIG. 11, the magneto-electric conversion element 53 is arranged in the middle of the surrounding portion 55. Also in this case, this example is structured such that the magnetic flux converged by the high permeability member 57 is incident almost perpendicularly to the magnetic flux detection surface of the magneto-electric conversion element 53.

The Third Embodiment

Figure 12:
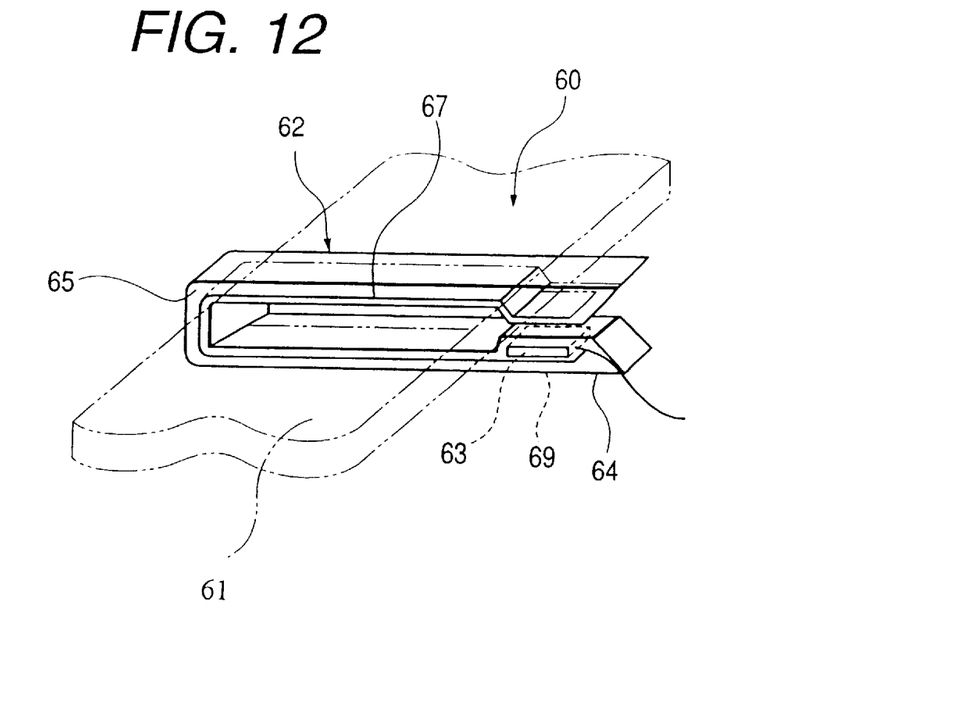
FIG. 12 is a perspective view showing the fixed type current detector of the third embodiment.
Figure 13:
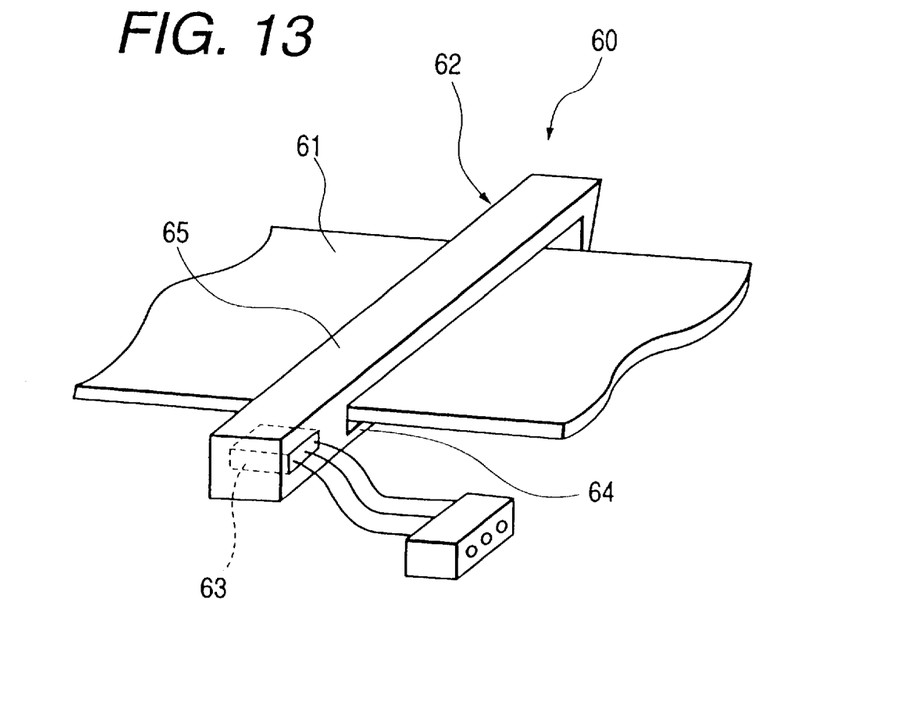
FIG. 13 shows an example of the modification of the fixed type current detector in FIG. 12, and is a perspective view showing an example in which the magneto-electric conversion element is provided on the surrounding portion.

The third embodiment will be described as shown in FIG. 12 and FIG. 13,. FIG. 12 is a perspective view showing a fixed type current detector 60 of the third embodiment, and FIG. 13 is an example of the modification of the fixed type current detector 60 shown in FIG. 12.

The present embodiment is used for, as a conductor 61, a flat cable or a plate-like bus bar.

As shown in FIG. 12, the fixed type current detector 60 is fixed along the peripheral direction of the conductor 61, such as the bus bar. The fixed type current detector 60 includes: a flexible magnetic flux converging fixed member 62 and converging the magnetic flux generated around the conductor 61 when the current flows through the conductor 61; and a magneto-electric conversion element 63 integrally provided with the flexible magnetic flux converging fixed member 62, and detecting the magnet flux of the flexible magnetic flux converging fixed member 62.

The magnetic flux converging fixed member 62 is formed of: a base portion 64 formed of resins; a surrounding portion 65 which is integrally provided onto the base portion 64 and wound around the outer periphery of the conductor 61; and a high permeability member 67 which is provided on the surrounding portion 65 and can converge the magnetic flux generated around the conductor 61.

When the surrounding portion 65 is wound around the outer periphery of the conductor 61 such as a bus bar, the surrounding portion 65 nips the conductor 61 by its own spring force, and is fixed onto the conductor 61.

In this manner, the surrounding portion 65 is wound around and fixes to the outer periphery of the conductor 61. The high permeability member 67 laid along the surrounding direction converges the magnetic flux generated around the conductor 61 by the current flowing through the conductor 61.

Further, a magneto-electric conversion element engagement portion 69 engaged in the magneto-electric conversion element 63 is formed on the base portion 64. The magneto-electric conversion element 63 engaged in the magneto-electric conversion element engagement portion 69 is arranged in the direction in which the magnetic flux detection surface of the magneto-electric conversion element 63 is perpendicular to the magnetic flux converged by the high permeability member 67 of the surrounding portion 65. Further, the magneto-electric conversion element 63 is connected to an over current protection apparatus (not shown).

This fixed type current detector 60 is easily attached onto the outer periphery of the conductor 61 by its own spring force by winding the surrounding portion 65 around the outer periphery of the conductor 61. In this state, when the current is supplied to the conductor 61, the magnetic flux generated around the conductor 61 by the current flowing through the conductor 61, is converged by the high permeability member 67 integrally formed on the surrounding portion 65. The converged magnetic flux is detected by the magneto-electric conversion element 63 engaged in the base portion 64, and converted into an electrical output. Then, the converted electrical output is supplied to the over current protection apparatus (not shown).

In the present embodiment, because the base portion 64 and the surrounding portion 65 are integrally formed, and the magneto-electric conversion element 63 is engaged in the base portion 64, and is assembled and fixed onto the conductor 61 integrally with the surrounding portion 65, thereby, at the time of assembling onto the conductor 61, the positional relationship of the magneto-electric conversion element 63 to the conductor 61 is not slipped, and the fixed type current detector 60 can be easily assembled and fixed.

Further, because the magneto-electric conversion element 63 is arranged in the closest distance to the conductor 61, the magneto-electric conversion detection sensitivity of the magneto-electric conversion element 63 is increased, and the detection accuracy is increased.

Further, the positional slippage of the magneto-electric conversion element 63 due to the vibration stress or impact stress is prevented, and the detection accuracy is stabilized.

In an example of the modification shown in FIG. 13, the arrangement of the magneto-electric conversion element 63 is different to the fixed type current detector 60 in FIG. 12. As shown in FIG. 13, in this example, the magneto-electric conversion element 63 is arranged in the middle portion and the turning back portion of the surrounding portion 65.

Incidentally, in each embodiment and each example of the modification, an example in which the high permeability members 26, 57, and 67 are laid in the band portion 24, the surrounding portions 55, and 65, is shown, however, as the high permeability members 26, 57, and 67, the high permeability coating may be coated on the band portion 24, the surrounding portions 55, and 65, or the high permeability film may be adhered onto the band portion 24, the surrounding portions 55 and 65.

As described above, a magnetic flux converging fixed member to converge the magnetic flux generated around the conductor, and the magneto-electric conversion element to detect the magnetic flux of the magnetic flux converging fixed member are integrally formed, and when magnetic flux converging fixed member is wound around the outer periphery of the conductor, the assembling and fixing operation onto the conductor becomes easy, and the positional slippage of the magneto-electric conversion element does not occur, at the time of the assembling and fixing operation. Further, the positional slippage of the magneto-electric conversion element due to the vibration stress can be prevented. As the result, the detection accuracy is increased and stabilized.

A band portion with which the high permeability member is integrally formed, a lock portion to engage and fix the band portion, and a magneto-electric conversion element provided either one of the band portion or the lock portion, are integrally formed, and when the band portion is wound around the outer periphery of the conductor and engaged and fixed by the lock portion, the assembling and fixing operation onto the conductor becomes easy, and the positional slippage of the magneto-electric conversion element does not occur, at the time of the assembling and fixing operation. Further, the positional slippage of the magneto-electric conversion element due to the vibration stress, can be prevented. As the result, the detection accuracy is increased and stabilized.

Further, because the band portion has the flexibility, the band portion can cope with any type of the conductor without depending on the type of conductors, and can be easily assembled and fixed.

The surrounding portion with which the high permeability member is integrally formed, a base portion, and a magneto-electric conversion element provided in the base portion are integrally formed. Then, when the surrounding portion is wound around the outer periphery of the conductor, the fixed type current detector is assembled and fixed onto the conductor.

Accordingly, the assembling and fixing operation onto the conductor becomes easy, and the positional slippage of the magneto-electric conversion element does not occur, at the time of the assembling and fixing operation. Further, the positional slippage of the magneto-electric conversion element due to the vibration stress, can be prevented. As the result, the detection accuracy is increased and stabilized.

The high permeability member which is integrally formed on the band portion, is formed into 2 layers. The first layer high permeability member arranged on the conductor side, converges the magnetic flux generated around the conductor, and the second high permeability member arranged outside converges the magnetic flux due to the disturbance. As the result, the detection accuracy is further increased.

Because a plurality of fixed type current detectors are wound around a plurality electric cables, the high detection accuracy can be obtained. Further, the assembling and fixing space of the fixed type current detectors can be reduced.

What is claimed is:

1. A fixed type current detector detecting a magnetic flux generated around a conductor comprising:

a magnetic flux converging fixed member having a flexible composition that is adaptable to be fixed around the periphery of said conductor, said magnetic flux converging fixed member converging magnetic flux;

a magneto-electric conversion element integrally provided on said magnetic flux converging fixed member, said magneto-electric conversion element detecting converged magnetic flux, wherein said magnetic flux converging fixed member comprises:

a band portion adapted to be wound around said periphery of said conductor;

a lock portion provided on one side of said band portion, said lock portion adapted to engage and fix the other side of said band portion;

a high permeability member integrally formed along a longitudinal direction of said band portion, said high permeability member being able to converge said magnetic flux; and said magneto-electric conversion element integrally provided with one of said band portion and said lock portion.

2. A fixed type current detector according to claim 1, wherein said conductor is wound and fixed by a plurality of said fixed type current detectors.

3. A fixed type current detector according to claim 1, wherein said conductor is formed by a plurality of electric wires.

4. A fixed type current detector according to claim 1, wherein said magneto-electric conversion element has a magnetic flux detection surface arranged in a direction substantially perpendicular to a direction of said converged magnetic flux.

5. A fixed type current detector according to claim 1, wherein said magnetic flux converging fixed member further comprises:

a base portion;

a surrounding portion integrally provided with said base portion, said surrounding portion being fixed around said periphery of said conductor;

a high permeability member integrally provided with said surrounding portion, said high permeability member being able to converge said magnetic flux; and said magneto-electric conversion element is integrally provided with one of said base portion and said surrounding portion.

6. A fixed type current detector according to claim 5, wherein said surrounding portion is substantially circle-shaped.

7. A fixed type current detector according to claim 5, wherein said surrounding portion includes a bar portion and a connecting portion, said bar portion is elastically connected to said base portion via said connecting portion.

8. A fixed type current detector detecting a magnetic flux generated around a long conductor comprising:

- a magnetic flux converging fixed member fixed around the periphery of said long conductor, said magnetic flux converging fixed member converging magnetic flux; and
- a magneto-electric conversion element integrally provided on said magnetic flux converging fixed member, said magneto-electric conversion element detecting converged magnetic flux, wherein said magnetic flux converging fixed member includes:
  - a band portion wound around said periphery;
  - a lock portion provided on one side of said band portion, said lock portion engaging and fixing the other side of band portion;
  - a high permeability member integrally formed along a longitudinal direction of said band portion, said high permeability member being able to converge said magnetic flux; and said magneto-electric conversion element is integrally provided with one of said band portion and said lock portion, and wherein said high permeability member is formed by a plurality of layers.

9. A fixed type current detector detecting a magnetic flux generated around a long conductor comprising:

- a magnetic flux converging fixed member fixed around the periphery of said long conductor, said magnetic flux converging fixed member converging magnetic flux; and
- a magneto-electric conversion element integrally provided on said magnetic flux converging fixed member, said magneto-electric conversion element detecting converged magnetic flux, wherein said magnetic flux converging fixed member includes:
  - a base portion;
  - a surrounding portion integrally provided with said base portion, said surrounding portion fixed around said periphery;
  - a high permeability member integrally provided with surrounding portion, said high permeability member being able to converge said magnetic flux; and said magneto-electric conversion element integrally provided with one of said base portion and said surrounding portion, and wherein said high permeability member is formed by a plurality of layers.

* * * * *